United States Patent [19]
Lommen et al.

[11] Patent Number: 6,080,930
[45] Date of Patent: Jun. 27, 2000

[54] ESD/EMC GASKET

[75] Inventors: Joseph John Lommen; Scott Mackenzie, both of Nepean, Canada

[73] Assignee: Nortel Networks Limited, Montreal, Canada

[21] Appl. No.: 09/085,226

[22] Filed: May 27, 1998

[51] Int. Cl.[7] .................................................. H05K 9/00
[52] U.S. Cl. ............................. 174/35 GC; 174/35 R; 361/816; 361/800; 361/802; 361/727
[58] Field of Search .......................... 174/35 R, 35 GC; 361/816, 818, 800, 799, 802, 752, 753, 727

[56] References Cited

U.S. PATENT DOCUMENTS

| | | | |
|---|---|---|---|
| 3,277,230 | 10/1966 | Stickney et al. | 174/35 GC |
| 5,311,408 | 5/1994 | Ferchau et al. | 361/818 |
| 5,610,368 | 3/1997 | Smith | 174/35 GC |
| 5,638,259 | 6/1997 | McCarthy et al. | 361/800 |

*Primary Examiner*—Dean A. Reichard
*Assistant Examiner*—Hung V Ngo

[57] ABSTRACT

A gasket for ESD (electrostatic discharge) protection and EMC (electromagnetic containment) for use in a card cage used to house slidable circuit modules. The gasket is engaged with a rear cross member of a shelf of the card cage, adjacent a backplane. The gasket has two ridges, namely an ESD ridge to provide ESD protection and an EMC ridge to contain electromagnetic wave energy emitted from a module. As a module is slid into the card cage towards the backplane, a surface of the module contacts the ESD ridge of the gasket, thereby discharging any static electricity on the module (because the gasket is grounded through connection to the shelf which is grounded to a frame). Contact of the module with the ESD ridge occurs before engagement of pins from the backplane with connectors on a surface of the module. As the module is further slid towards the backplane, the module contacts the EMC ridge of the gasket, thereby ensuring containment of electromagnetic wave energy having a wavelength greater than the distance from the EMC ridge to the backplane. Another aspect of the invention includes hooks at the ends of the gasket to connect the gasket to legs of the rear cross member. Another embodiment of the invention includes an EMC rounded surface instead of an EMC ridge.

26 Claims, 8 Drawing Sheets

ESD/EMC GASKET

FIELD OF THE INVENTION

The invention relates to gaskets for electronics equipment and is particularly concerned with gaskets that provide both electrostatic discharge (ESD) protection and electromagnetic containment (EMC).

BACKGROUND OF THE INVENTION

In electronics systems, many devices and techniques have been developed to provide electrostatic discharge (ESD) protection and to provide electromagnetic containment (EMC) or electromagnetic interference (EMI) shielding. Such protection is necessary in systems incorporating printed circuit boards housed within modules where the modules are mounted parallel to each other in a cabinet and connected to a common backplane.

In such systems, each module can be slid in or out of the cabinet. Each module is electronically connected to the backplane through engagement of pins projecting from the backplane with connectors attached to the module. As a module is slid into the cabinet along card guides, the pins of the backplane engage the connectors of the module, just prior to the module being completely slid into the cabinet.

When a user pushes a module into a cabinet, any static built up in the user may be discharged onto the module. It is important that this static be discharged from the module prior to the connectors of the module making contact with the pins of the backplane. Otherwise, the static will travel through the backplane pins toward electronic components connected to those pins and may damage those components.

Another concern associated with such systems is electromagnetic wave energy generated by electronic components within the modules. It is desirable to contain electromagnetic wave energy generated within each module; otherwise the emissions may adversely affect or interfere with the operation of other electronic components.

One technique for providing ESD protection is for the user to wear a wrist strap. Before the user touches a module, the user must attach the wrist strap to a grounded portion of the cabinet to discharge any static built up in the user. However, there are several concerns associated with this technique. First, it requires the user to wear an appropriate wrist strap. Second, it requires the user to remember to attach the wrist strap to the grounded portion of the cabinet before making contact with the module.

EMC is achieved in respect of a module by forming the module with a conductive outer housing providing an EMI shield extending along five sides. The rear side, however, has to be left unshielded because it is provided with connectors which engage with the pins from the backplane. As a result of the fashion in which the backplane pins engage with the connectors of the module, there is a gap between the rear side and the backplane. If no precautions are taken for EMC, electromagnetic wave energy could escape through this gap.

To address this problem, it is known to adhere gaskets along shelves of the cabinet to essentially bridge the gap between the module and the backplane. However, such gaskets tend to have an open end (ie: an end which is not held down) or and end which may not be technically open, but is only loosely held down. After the module has slid over such a gasket a number of times, the open end (or the end that is loosely held down) tends to snag against the moving module, thereby often damaging the gasket.

One technique for providing both ESD protection and EMC, without the user having to wear a wristband, has been suggested in U.S. Pat. No. 5, 311,408, which issued to Ferchau on May 10, 1994 for "Electronic Assembly with Improved Grounding and EMI Shielding." This patent describes a pin (an alignment pin) grounded to the backplane which makes contact with the module just prior to the connector pins of the backplane connecting with the connectors of the module. Thus, the module is grounded prior to the engagement of the pins of the backplane with the connectors of the module. The patent requires an additional separate gasket to provide EMI shielding. However, the assembly described in this patent requires numerous specially designed parts, some of which require relatively precise adjustment to ensure proper engagement of the various parts. It would be desirable to provide ESD protection and EMC without the necessity of using many parts and without requiring involved installation to ensure relatively precise interaction of the various parts.

SUMMARY OF THE INVENTION

It is an object of the invention to obviate or mitigate one or more of the above identified disadvantages.

According to a first broad aspect, the invention provides an electrically conductive, elongate, resilient gasket for use on a grounded shelf of a card cage, the card cage being used to house slidably removable circuit modules, the card cage having a forward portion and a rear portion, the modules having a rear surface with connectors, the rear portion of the card cage being adjacent to a backplane, the backplane having pins for engagement with the connectors of the module, the gasket being adapted for engagement with the shelf adjacent the backplane, wherein the gasket comprises a front edge extending lengthwise along the gasket, a rear edge extending lengthwise along the gasket, an ESD contact ridge located between the front edge and the rear edge and extending lengthwise along the gasket, and an EMC contact ridge located between the ESD contact ridge and the rear edge and extending lengthwise along the gasket, wherein, when the gasket is engaged with the shelf, as a module is slid into the card cage towards the backplane, a surface of the module contacts the ESD contact ridge prior to the pins of the backplane engaging the connectors of the rear surface of the module, and the EMC contact ridge is positioned relative to the rear edge of the gasket to provide electromagnetic containment of electromagnetic energy emitted from the module.

In accordance with another broad aspect, the invention provides a card cage comprising an upper shelf, a lower shelf, a forward portion and a rear portion, the card cage being of the type used to house slidably removable circuit modules between the upper shelf and the lower shelf, the modules having a rear surface with connectors, the rear portion of the card cage to be positioned adjacent to a backplane, the backplane having pins for engagement with the connectors of the module, each shelf having mounted thereon an electronically conductive, elongate, gasket adjacent the rear portion, wherein each gasket comprises a front edge extending lengthwise along the gasket, a rear edge extending lengthwise along the gasket, an ESD contact ridge located between the front edge and the rear edge and extending lengthwise along the gasket, and an EMC contact ridge located between the ESD contact ridge and the rear edge and extending lengthwise along the gasket, wherein, as a module is slid into the card cage towards the backplane, a surface of the module contacts the ESD contact ridge prior to the pins of the backplane engaging the connectors of the rear surface of the module, and the EMC contact ridge is positioned relative to the rear edge of the gasket to provide electromagnetic containment of electromagnetic energy emitted from the module.

Advantages of the invention include the provision of a relatively inexpensive device, which is relatively easy to install, for providing both ESD protection and EMC.

BRIEF DESCRIPTION OF THE DRAWINGS

Preferred embodiments of the invention will now be described with reference to the attached drawings in which

FIG. 3b is a magnified view of the circled portion of FIG. 3a;

FIG. 4b is a rear perspective view of the gasket of FIG. 4a.

DETAILED DESCRIPTION OF THE PREFERRED EMBODIMENTS

Figure 1A:
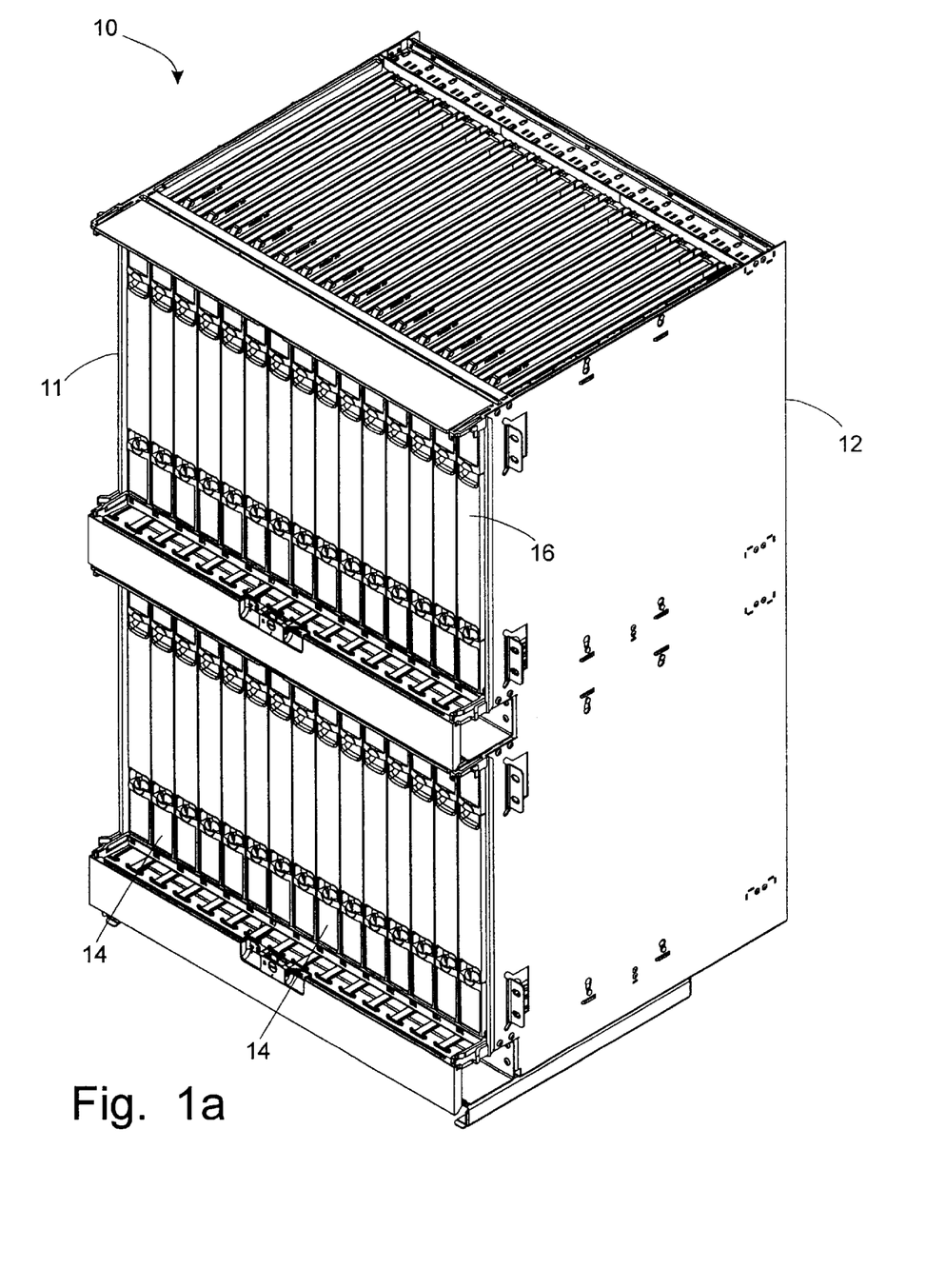
FIG. 1a is a front perspective view of a double height shelf housing a number of circuit modules.

As shown in the front perspective view of FIG. 1a, a cabinet or double height shelf 10 has a front surface 11 and a rear surface 12. Typically, two double height shelves 10 are housed within a frame or bay or cabinet (not shown). The double height shelf 10 houses a number of circuit modules or packs 14 oriented parallel to each other. As shown in FIG. 1c, each circuit module 14 has a top surface 15, a bottom surface 17, two side surfaces 19 (only one side surface 19 is shown in FIG. 1a) and the module 14 encloses a circuit board (not shown). A rear surface (not shown) of each module 14 has connectors (not shown) for engagement with pins (not shown) protruding from a backplane 36 (the backplane 36 is shown schematically in FIG. 2). A faceplate 16 covers the front surface of each module 14.

Figure 1B:
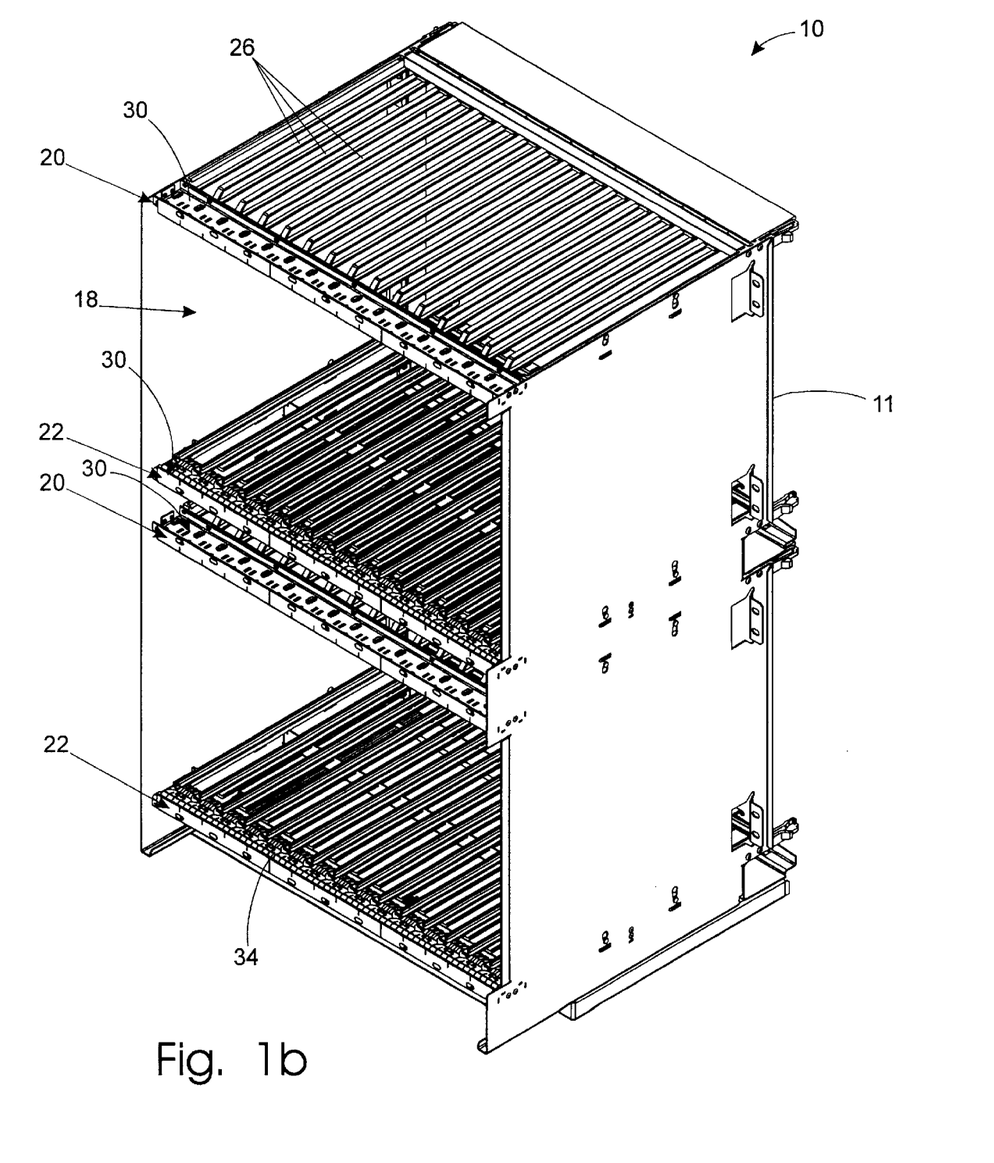
FIG. 1b is a rear perspective view of a double height shelf, without modules, having gaskets engaged with rear cross members of shelves of the double height shelf, in accordance with an embodiment of the current invention.
Figure 1C:
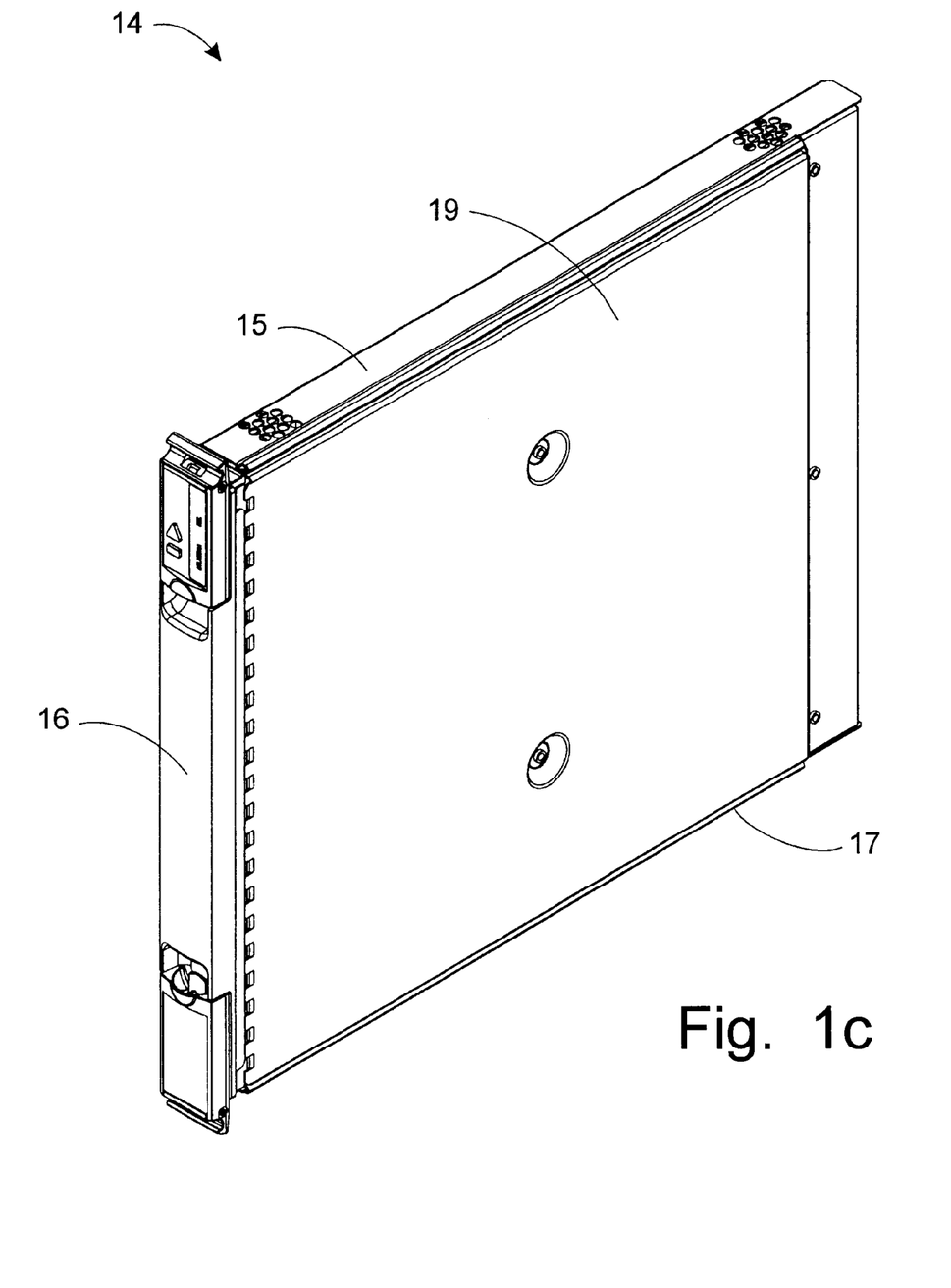
FIG. 1c is a front perspective view of a representative circuit module.

As shown in FIG. 1b, which is a rear perspective view of double height shelf 10 with the modules 12 removed, the double height shelf 10 has two card cages 18, each of which accommodates a row of modules 14, as shown in FIG. 1a. Each card cage 18 has an upper shelf 20 and a lower shelf 22.

Each shelf 20, 22 has a series of parallel module card guides 26. Each module 14 is guided and slides in a card cage 18 between two adjacent card guides 26 in the upper shelf 20 and between two adjacent card guides 26 in the lower shelf 22.

Extending across a rear portion of each shelf 20, 22 is a rear cross member 30. As will be discussed in greater detail below, a gasket 34 is hooked along a surface of each rear cross member 30. With respect to the lower shelf 22, the gasket 34 is clipped to a surface of the rear cross member 30 facing the upper shelf 20. With respect to the upper shelf 20, the gasket 34 (not shown) is clipped to a surface of the rear cross member 30 facing the lower shelf 22.

Figure 2:
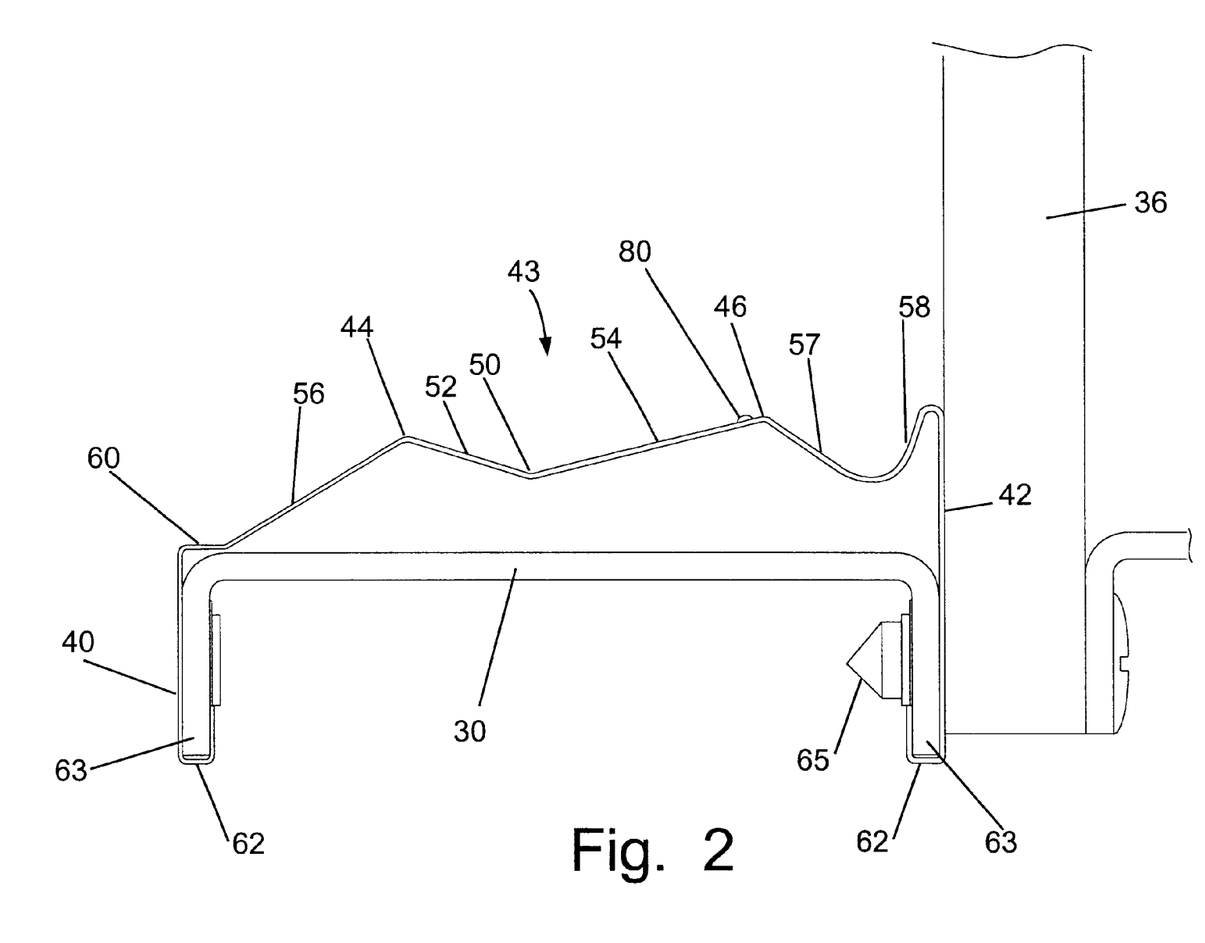
FIG. 2 is a schematic side view, drawn to a larger scale, of a gasket, engaged with a rear cross member, adjacent a backplane.

Adjacent to and extending across rear surface 12 (and rear cross members 30) of the double height shelf 10 is a backplane 36 (shown schematically in FIG. 2). As mentioned above, the pins extending from the backplane 36 are designed to engage with connectors located on the rear surface (not shown) of modules 14.

The gasket 34 will now be described in detail with reference primarily to the perspective view of the gasket 34 shown in FIGS. 3a and 3b and the side view of FIG. 2. As seen in FIG. 2, in side view, the gasket 34 is generally formed as a U-shaped channel having two spaced edges or legs 40 and 42 between which extend web 43. Considering the width direction of the gasket 34, the leg 40 closer to the front surface 11 of the shelf 10 will be referred to as the forward leg and the leg 42 will be referred to as the rear leg. The gasket 34 is made of a flexible, spring-like material which is or is coated with a conductive material, preferably the same material as the exterior surface of module 14, which may be, for example, beryllium copper or "spring steel".

Continuing to refer to FIG. 2, the web 43 generally undulates and defines an ESD contact ridge 44 followed by an EMC contact ridge 46. The rear leg 42 extends higher than the forward leg 40, and EMC contact ridge 46 extends higher than ESD contract ridge 44, such that the gasket 34 slopes generally upwardly from the forward leg 40 to the rear leg 42. A nadir 50 is located between ESD contact ridge 44 and EMC contact ridge 46. Between nadir 50 and ESD contact ridge 44 is a sloping surface 52 and between nadir 50 and EMC contact ridge 46 is a sloping surface 54. Adjacent and forward of ESD contact ridge 44 is a sloping surface 56. A flat section 60 is located between sloping surface 56 and the forward leg 40. Rearward of EMC contact ridge 46 are sloping surfaces 57, 58 connected to each other through curved joinder. Sloping surface 58, which is remote from sloping surface 57, is connected to rear leg 42 through curved joinder.

A lower portion of the forward leg 40 and a lower portion of the rear leg 42 have hook portions 62 which hook around leg portions 63 of the rear cross member 30. When the gasket 34 is hooked onto the rear cross member 30 as shown in FIG. 2, the rear leg 42 of the gasket is in contact with the backplane 36. A screw 65 may also extend through back plane 36, gasket 34 and rear cross member 30.

Figure 3A:
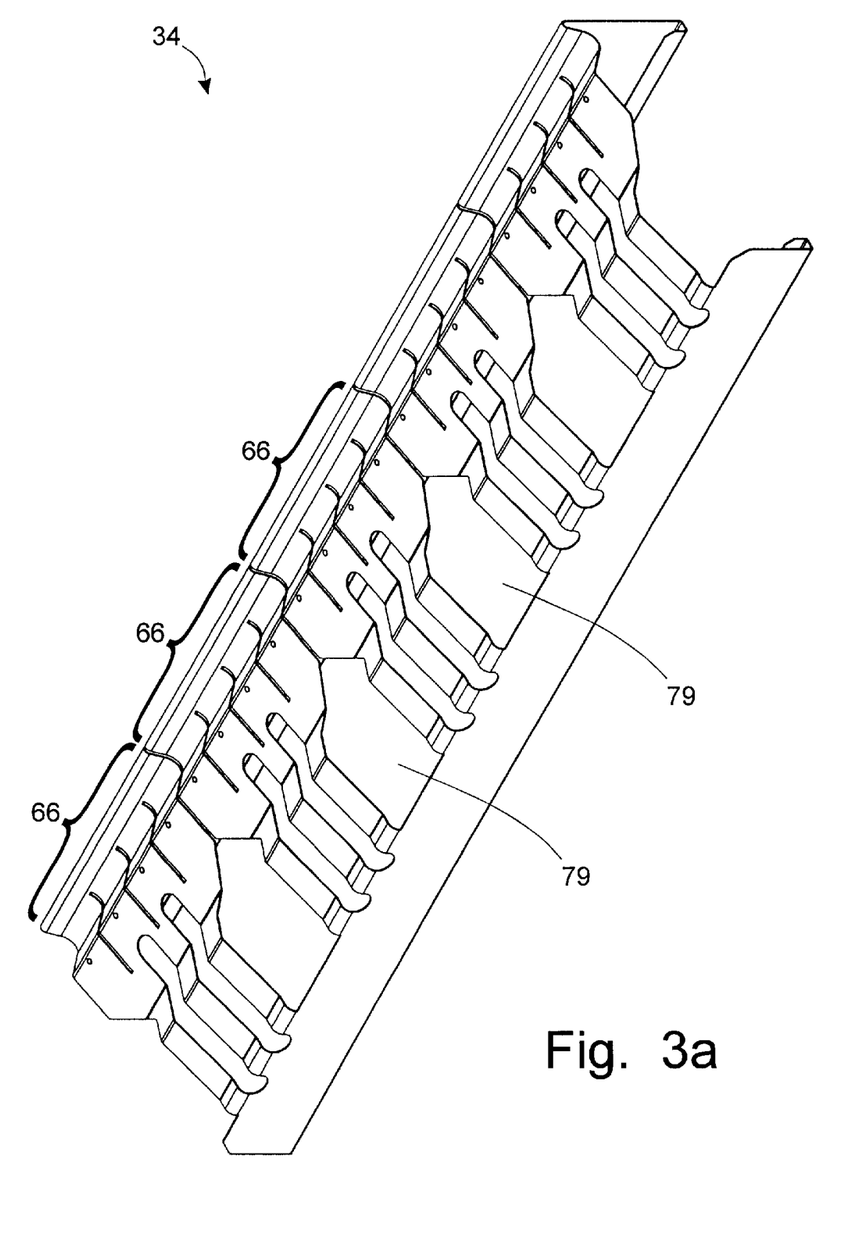
FIG. 3a is a front perspective view of the gasket of FIG. 2.
Figure 3B:
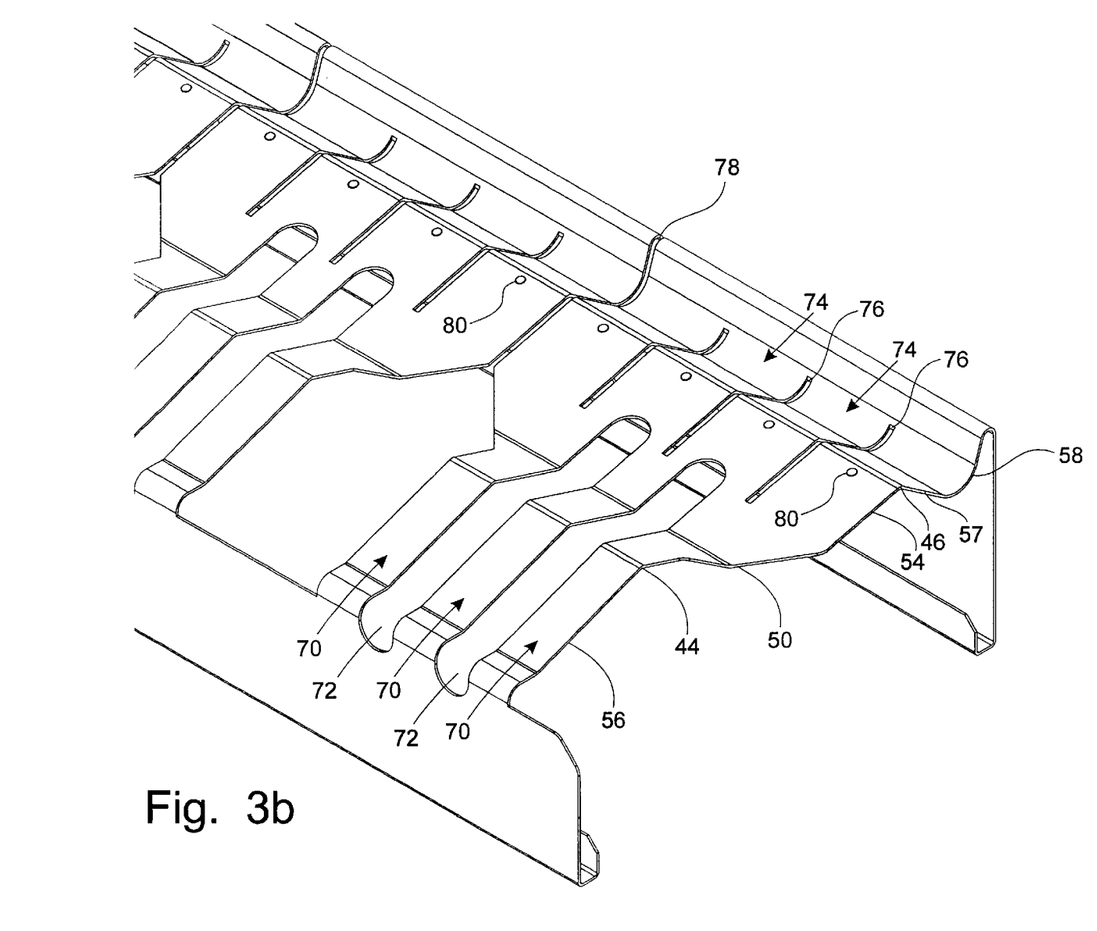

Referring to FIG. 3a, there is depicted a front perspective view of the gasket 34 showing that the web 43 is provided with slots and gaps of different lengths, all running generally perpendicular to the longitudinal axis of the gasket. The gasket shown in FIG. 3a has five groupings or trees 66. A magnified view of most one tree 66 is shown in FIG. 3b. Each tree 66 has three trunks 70, separated by gaps 72, and four branches 74, separated by slots 76. Adjacent trees 66 are separated by a slot 78. The gaps 72 extend part-way into forward leg 40. The slots 78 extend, in one direction, part-way into rear leg 42, and the slots 78 extend, in the other direction, into a wide gap 79.

Each trunk 70 incorporates an ESD contact ridge 44 and adjacent sloping surfaces 52, 56. Each branch 74 incorporates an EMC contact ridge 46, adjacent sloping surfaces 54, 57 as well as sloping surface 58. The branches 74 are joined to the trunks 70 at the nadir 50. As shown in FIG. 3b, each EMC contact ridge 46 has a raised dimple 80, located mid-way across a width of the EMC contact ridge 46.

The function of the slots 76, 78 and gaps 72, 79 is to provide resilient trunks 70 and branches 74 which can each independently conform to the bottom surface 17 of the module 14 with an appropriate contact force as described below.

A plurality of gaskets 34 is arranged along the rear cross member 30 to cover the length of the rear cross member 30.

To install the gasket 34 onto rear cross member 30, one hook portion 62 of the gasket 34 is manually hooked around one leg portion 63 of the rear cross member 30 and then the other hook portion 62 is manually hooked around the other leg portion 63.

The function of the gasket 34 will now be described. When a module 14 is inserted into the card cage 18, it enters the card cage 18 at the forward surface 11 and is pushed towards the rear surface 12, being guided between the lower shelf 22 and the upper shelf 20 along card guides 26.

For the sake of simplicity, the following description will only consider the interaction of the bottom surface 17 of module 14 with the gasket 34 hooked onto the lower shelf 22 of the card cage 18. However, it should be noted that the identical interaction occurs simultaneously between the top surface 15 of the module 14 and the gasket 34 hooked onto the upper shelf 20 of the card cage 18.

Just subsequent to the module 14 being pushed beyond a threshold of rear cross member 30 towards the backplane 36, the bottom surface 17 of the module 14 comes into contact with sloping surface 56 of the gasket 34. More specifically, this first contact must occur at or before ESD contact ridge 44. Because of the conductive nature of the gasket 34, any static built up on the module 34 is discharged onto the gasket 34, which static is in turn discharged onto the shelf 10, which static is in turn discharged onto the frame (not shown) which is (electrically) grounded.

Due to the flexible nature of the gasket 34, as the bottom surface 17 of the module 14 makes contact with sloping surface 56 and then makes contact with ESD contact ridge 44, ESD contact ridge 44 is pushed down, thereby reversibly flattening sloping surfaces 52, 56 to an extent.

After the bottom surface 17 of the module 14 makes contact with ESD contact ridge 44, as the module is pushed towards backplane 36, the bottom surface 17 of the module 14 next contacts sloping surface 54 of the gasket 34. More specifically, this next contact must occur at or before dimple 80.

The module 14 is then pushed towards backplane 36 as far as it will go, with the result that a rear surface (not shown) of the module 14 (the surface bearing connectors) typically rests approximately mid-way between EMC contact ridge 46 and backplane 36.

As the bottom surface 17 of the module 14 passes over the dimple 80, the dimple 80 is pushed down, thereby reversibly flattening sloping surfaces 54, 57 to an extent.

It is necessary that initial contact of the bottom surface 17 of the module 14 with sloping surface 56 occur prior to initial contact of the pins (not shown) of the backplane 36 with the connectors (not shown) on the rear surface (not shown) of the module 14, to ensure that static on the module 14 is discharged prior to engagement of the pins of the backplane 36 to the connectors of the module 14.

The initial contact between the bottom surface 17 of the module 14 and the gasket 34 at or before ESD contact ridge 44 need not be of high force. In fact, the bottom surface 17 of the module 14 need not remain in contact with ESD contact ridge 44 after the rear surface of the module 14 has moved past ESD contact ridge 44 towards the backplane 36, because any static on the module 14 will have been discharged during the initial contact between the module 14 and the ESD contact ridge 44. Accordingly, in the preferred embodiment, the ESD contact ridge 44 only exerts low force against the module 14 so as not to unnecessarily hinder the user from pushing the module 14 past the ESD contact ridge 44.

However, while the bottom surface 17 of the module 14 remains over dimple 80 (ie: until the module 14 is withdrawn from the gasket 34), there must be constant contact between the dimple 80 and the bottom surface 17 of the module 14 to ensure adequate EMC. The relatively high force between the dimple 80 and the bottom surface 17 of the module 14 is maintained by the bending moment resulting from the compression or collapsing of sloping surfaces 54, 57. This contact between the dimple 80 and surface 17 of the module ensures that electromagnetic energy is contained within a volume defined by five surfaces of the module 14 (ie: all surfaces of the module 14 excluding the rear surface) in addition to a surface of the backplane 36 between the gaskets 34 attached to the shelves 20, 22 above and below the module 14.

Preferably, the contact between the dimple 80 and the bottom surface 17 of the module 14 will be of sufficiently high force to create a gas-tight seal. Such a gas-tight seal guarantees containment and prevents corrosion of the parts in contact with each other. If corrosion is allowed to occur, contact between the module 14 and the dimple 18 cannot be guaranteed, which affects lower frequency containment. High frequency containment need not have a dimple 80, as described below.

With the above-described embodiment, there is containment of electromagnetic wave energy having a wavelength greater than a particular wavelength, as described below. There are two relevant distances which determine the minimum wavelength contained. One distance is the distance between adjacent dimples 80. The other distance is the distance between EMC contact ridge 46 and the backplane 36. If electromagnetic energy has a wavelength less than the distance between adjacent dimples 80, such energy could escape between the dimples 80 and interfere with electronic components located below the lower shelf 22. Similarly, if electromagnetic energy has a wavelength less than the distance between the EMC contact ridge 46 and the backplane 36, such energy could escape through slot 76 or slot 78, since these slots essentially extend from EMC contact ridge 46 to the backplane 36.

For ease of reference, "the slot length" will be defined as the greater of (a) the distance between adjacent dimples 80, and (b) the distance between EMC contact ridge 46 and the backplane 36. The above-described embodiment of the invention will therefore contain electromagnetic energy having wavelength greater than the slot length.

It should be noted that the number and configuration of the trees 66 of the gasket 34 shown in FIG. 3a can vary considerably, given the following parameters:

It is preferable that both ends or hook portions 62 of the gasket 34 be held down so that there are no free ends which may become snagged with the bottom surface 17 of the module 14 as the module 14 slides past.

As the bottom surface 17 of the module 14 slides towards the backplane 36, it should contact the sloping surface 56 of the gasket 34 at or before ESD contact ridge 44.

The bottom surface 17 of the module 14 should contact ESD contact ridge 44 prior to the pins of the backplane 36 contacting the connectors of the module.

As the bottom surface 17 of the module 14 slides along sloping surface 56 and over ESD contact ridge 44, the sloping surfaces 52, 56 are somewhat flattened. When the module 14 is withdrawn from the ESD contact ridge 44, the sloping surfaces 52, 56 should return to their initial slopes substantially without deformation.

As the module 14 is pushed from ESD contact ridge 44 towards the backplane 36, the bottom surface 17 of the module 14 should contact sloping surface 54 at or before dimple 80.

As the bottom surface 17 of the module 14 slides along sloping surface 54 and over the dimple 80, the sloping surfaces 54, 57 are somewhat flattened. When the module 14 is withdrawn from dimple 80, the sloping surfaces 54, 57 should return to their initial slopes substantially without deformation.

When the module 14 is locked or in position in the card cage 18, the rear surface of the module 14 should be located over dimple 80 or between dimple 80 and the backplane 36.

When the module 14 is locked or in position in the card cage 18, each dimple 18 should maintain contact with the bottom surface 17 of the module 14.

With the above-noted parameters in mind, the gasket 34 could have an infinite number of potential configurations. For example, each tree 66 could have a single trunk 70 with a single branch 74. Alternatively, each tree 66 could have X trunks 70 and Y branches 74, where X and Y could conceivably be any numbers greater than 1, although preferably, Y will be less than or equal to X+1.

Figure 4A:
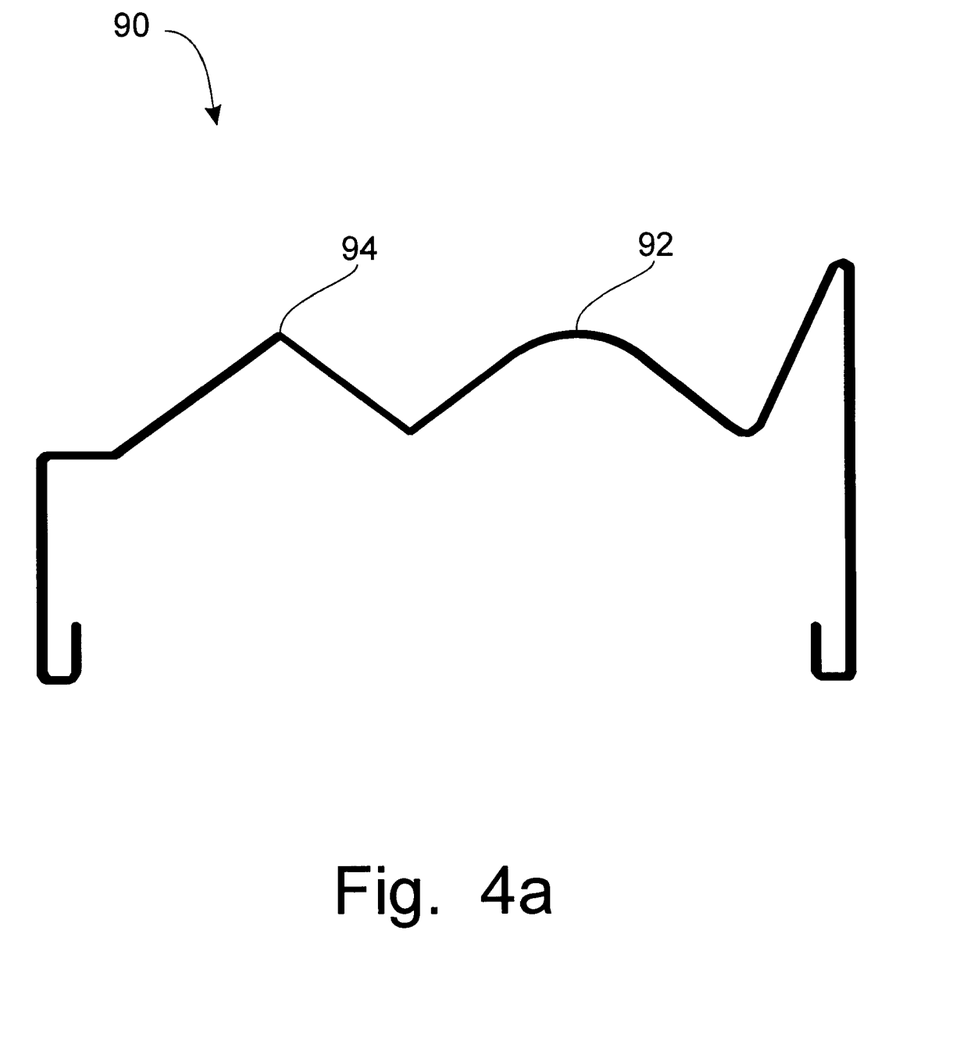
FIG. 4a is a side view of a gasket according to another embodiment of the present invention.
Figure 4B:
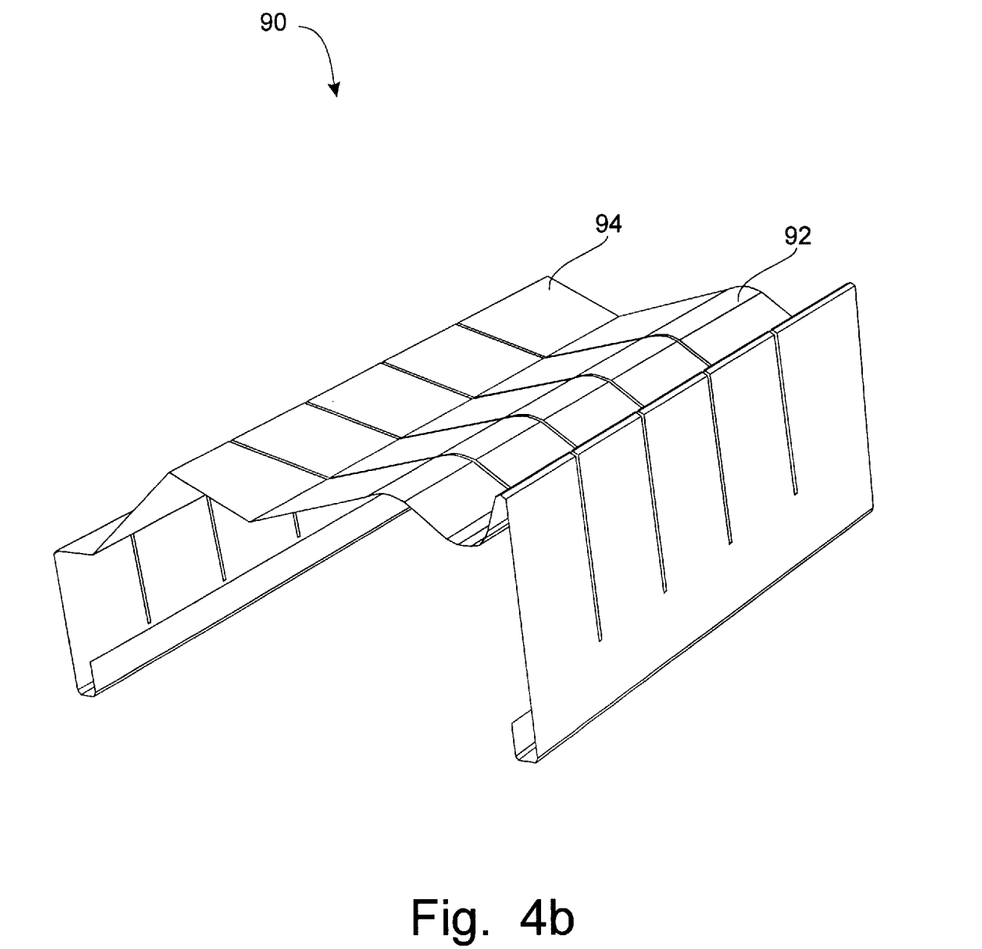

As an example of a different configuration of a gasket, FIGS. 4a and 4b, which are side and rear perspective views, respectively, show a gasket 90, in accordance with another embodiment of the present invention. The side view of gasket 90, as shown in FIG. 4a, is similar to the side view of gasket 34 shown in FIG. 2. A significant difference between the two gaskets 34, 90 is that whereas gasket 34 has a well-defined inverted V-shaped EMC contact ridge 46, gasket 90 has an EMC rounded surface or arc shaped contact ridge 92. Accordingly, whereas the bottom surface 17 of the module 14 comes into contact with the small surface area of dimple 80 of gasket 34, with respect to gasket 90, the lower surface 17 of the module 14 comes into contact with the relatively much larger surface area of an upper portion of the EMC rounded surface 92.

Another difference between gaskets 34 and 90, is that whereas, in gasket 34, in the preferred embodiment, the ESD contact ridge 44 does not extend as high as EMC contact ridge 46, in gasket 90, the ESD contact ridge 94 extends substantially to the same height as EMC rounded surface 92.

The EMC rounded surface 92 against the lower surface 17 of the module 14 creates a capacitive effect which shields or contains high frequency electromagnetic wave energy but is not particularly effective in containing low frequency electromagnetic wave energy. However, if the gasket 90 is designed as described above, such that as long as the lower surface 17 of module 14 is over the gasket 90, both ESD contact ridge 94 and rounded surface 92 remain in contact with the lower surface 17 of module 14, then the EMC rounded surface 92 will act to contain high frequency electromagnetic wave energy as described above, and the ESD contact ridge 94 will contain low frequency electromagnetic wave energy for wavelengths greater than the distance from the ESD contact ridge 94 to the backplane 36. Preferably, if ESD contact ridge 94 is used to contain low frequency electromagnetic wave energy, each ESD contact ridge 94 should contain a dimple such as dimple 80 described above with respect to EMC contact ridge 46.

Numerous modifications and variations of the present invention are possible in light of the above teachings. It is therefore to be understood that within the scope of the appended claims, the invention may be practiced otherwise than as specifically described herein.

We claim:

1. An electronically conductive, elongate, resilient gasket for use on a grounded shelf of a card cage, the card cage being used to house slidably removable circuit modules, the card cage having a forward portion and a rear portion, the modules having a rear surface with connectors, the rear portion of the card cage being adjacent to a backplane, the gasket being adapted for engagement with the shelf adjacent the backplane, wherein the gasket comprises a front edge extending lengthwise along the gasket, a rear edge extending lengthwise along the gasket, an ESD contact ridge located between the front edge and the rear edge and extending lengthwise along the gasket, and an EMC contact ridge located between the ESD contact ridge and the rear edge and extending lengthwise along the gasket, wherein, when the gasket is engaged with the shelf, as a module is slid into the card cage towards the backplanes a surface of the module contacts the ESD contact ridge prior to the connectors of the rear surface of the module engaging the backplane, and the EMC contact ridge is positioned relative to the rear edge of the gasket to provide electromagnetic containment of electromagnetic energy emitted from the module and wherein the EMC contact ridge is higher than the ESD contact ridge, whereby a higher force is required to slide the module past the EMC ridge than the ESD ridge.

2. The gasket of claim 1 wherein each of the ESD contact ridge and the EMC contact ridge is V-shaped.

3. The gasket of claim 1 wherein the EMC contact ridge is designed such that, after the module is slid over the EMC contact ridge, the EMC contact ridge remains in contact with the module until the module is withdrawn from the EMC contact ridge.

4. The gasket of claim 1 wherein the ESD contact ridge is V-shaped and the EMC contact ridge is arc-shaped.

5. The gasket of claim 1 wherein the gasket is engageable with a rear cross member of the shelf.

6. The gasket of claim 5 wherein the gasket further comprises attachment means for attachment to the rear cross member and wherein the attachment means comprises one or more free ends wherein, when the gasket is engaged with the rear cross member, each free end is positioned remote from the module, whereby no free end can contact the module.

7. The gasket of claim 1 wherein the gasket further comprises a web located between the front edge and the rear edge of the gasket, the ESD ridge and the EMC ridge being incorporated as part of the web, the web further including gaps to divide the ESD ridge into independently resilient ESD portions, and the web further including slots to divide the EMC ridge in to independently resilient EMC portions.

8. The gasket of claim 7 wherein each independently resilient EMC portion comprises a raised dimple.

9. The gasket of claim 8 wherein the distance between dimples on adjacent independently resilient EMC portions is no greater than the distance between the EMC contact ridge and the rear edge of the gasket.

10. The gasket of claim 7 wherein the gasket comprises groupings of independently resilient ESD portions and independently resilient EMC portions, wherein, within a grouping, adjacent independently resilient ESD portions are separated by a gap and adjacent independently resilient EMC portions are separated by a slot, and wherein adjacent groupings are separated by a spacing, the spacing comprising a long slot communicating with a wide gap.

11. The gasket of claim 10 wherein each grouping comprises three independently resilient ESD portions and four independently resilient EMC portions.

12. A card cage comprising an upper shelf, a lower shelf, a forward portion and a rear portion, the card cage being of the type used to house slidably removable circuit modules between the upper shelf and the lower shelf, the modules having a rear surface with connectors, the rear portion of the card cage to be positioned adjacent to a backplane, the backplane having pins for engagement with the connectors of the module, each shelf having mounted thereon an electronically conductive, elongate, gasket adjacent the rear portion, wherein each gasket comprises:

a front edge extending lengthwise along the gasket, a rear edge extending lengthwise along the gasket, an ESD contact ridge located between the front edge and the rear edge and extending lengthwise along the gasket, and an EMC contact ridge located between the ESD contact ridge and the rear edge and extending lengthwise along the gasket, wherein, as a module is slid into the card cage towards the backplane, a surface of the module contacts the ESD contact ridge prior to the pins of the backplane engaging the connectors of the rear surface of the module, and the EMC contact ridge is positioned relative to the rear edge of the gasket to provide electromagnetic containment of electromagnetic energy emitted from the module.

13. The card cage of claim 12 wherein each of the ESD contact ridge and each of the EMC contact ridge is V-shaped.

14. The card cage of claim 13 wherein the EMC contact ridge is higher than the ESD contact ridge, whereby a higher force is required to slide a module past the EMC ridge than the ESD ridge.

15. The card cage of claim 12 wherein the ESD contact ridge of each gasket is V-shaped and the EMC contact ridge is arc-shaped.

16. The card cage of claim 15 wherein the ESD contact ridge is substantially the same height as the EMC contact ridge.

17. The card cage of claim 12 wherein the EMC contact ridge of each gasket is designed such that, after the module is slid over the EMC contact ridge, the EMC contact ridge remains in contact with the module until the module is withdrawn from the EMC contact ridge.

18. The card cage of claim 12 wherein each of the upper shelf and the lower shelf has a rear cross member adjacent the rear portion of the card cage and each gasket is engageable with one rear cross member of the shelf.

19. The card cage of claim 18 wherein each gasket further comprises attachment means for attachment to one of the rear cross members and wherein each attachment means comprises one or more free ends wherein, when the gasket is engaged with a rear cross member, each free end is positioned remote from the module, whereby no free end can contact the module.

20. The card cage of claim 19 wherein the attachment means for each gasket comprise two hooks, one hook extending from the front edge of the gasket and the other hook extending from the rear edge of the gasket, each hook being adapted for engagement with a leg of the cross member.

21. The card cage of claim 12 wherein each of the gaskets further comprises a web located between the front edge and the rear edge of the gasket, the ESD ridge and the EMC ridge being incorporated as part of the web, the web further including gaps to divide the ESD ridge into independently resilient ESD portions, and the web further including slots to divide the EMC ridge into independently resilient EMC portions.

22. The card cage of claim 21 wherein each independently resilient EMC portion comprises a raised dimple.

23. The card cage of claim 22 wherein the distance between dimples on adjacent independently resilient EMC portions of each gasket is no greater than the distance between the EMC contact ridge and the rear edge of the gasket.

24. The card cage of claim 22 wherein each gasket comprises groupings of independently resilient ESD portions and independently resilient EMC portions, wherein, within a grouping, adjacent independently resilient ESD portions are separated by a gap and adjacent independently resilient EMC portions are separated by a slot, and wherein adjacent groupings are separated by a spacing, the spacing comprising a long slot communicating with a wide gap.

25. The card cage of claim 24 wherein each grouping comprises three independently resilient ESD portions and four independently resilient EMC portions.

26. An electronically conductive, elongate, resilient gasket for use on a rear cross member of a grounded shelf of a card cage, the card cage being used to house slidably removable circuit modules, the card cage having a forward portion and a rear portion, the modules having a rear surface with connectors, the rear portion of the card cage being adjacent to a backplane, the gasket being adapted for engagement with the shelf adjacent the backplane, wherein the gasket comprises a front edge extending lengthwise along the gasket, a rear edge extending lengthwise along the gasket, an ESD contact ridge located between the front edge and the rear edge and extending lengthwise along the gasket, an EMC contact ridge located between the ESD contact ridge and the rear edge and extending lengthwise along the gasket, attachment means for attachment to the rear cross member wherein the attachment means comprise two hooks with each hook having a free end, and wherein one hook extends from the front edge of the gasket and the other hook extends from the rear edge of the gasket, each hook being adapted for engagement with a respective leg of the cross member, wherein, when the gasket is engaged with the rear cross member, each free end is positioned remote from the module, whereby no free end can contact the module, wherein, when the gasket is engaged with the rear cross member of the shelf, as a module is slid into the card cage towards the backplane, a surface of the module contacts the ESD contact ridge prior to the connectors of the rear surface of the module engaging the backplane, and the EMC contact ridge is positioned relative to the rear edge of the gasket to provide electromagnetic containment of electromagnetic energy emitted from the module.

* * * * *